(12) United States Patent
Inoue

(10) Patent No.: US 7,606,086 B2
(45) Date of Patent: Oct. 20, 2009

(54) NONVOLATILE SEMICONDUCTOR MEMORY DEVICE

(75) Inventor: Koji Inoue, Ikoma (JP)

(73) Assignee: Sharp Kabushiki Kaisha, Osaka (JP)

( * ) Notice: Subject to any disclaimer, the term of this patent is extended or adjusted under 35 U.S.C. 154(b) by 139 days.

(21) Appl. No.: 11/730,675

(22) Filed: Apr. 3, 2007

(65) Prior Publication Data

US 2007/0242528 A1 Oct. 18, 2007

(30) Foreign Application Priority Data

Apr. 12, 2006 (JP) ............................. 2006-109909

(51) Int. Cl.
*G11C 7/00* (2006.01)
*G11C 7/22* (2006.01)

(52) U.S. Cl. .................. 365/189.15; 365/148; 365/158; 365/171; 365/173; 365/185.23

(58) Field of Classification Search ................ 365/148, 365/158, 189.15, 185.23
See application file for complete search history.

(56) References Cited

U.S. PATENT DOCUMENTS 6,259,644 B1   7/2001  Tran et al.
6,836,422 B1 * 12/2004  Perner et al. ............ 365/189.07
6,970,387 B2 * 11/2005  Smith et al. ............. 365/189.16
2005/0169038 A1  8/2005  Inoue et al.
2005/0276091 A1 12/2005  Inoue
2005/0276138 A1 * 12/2005  Inoue ........................ 365/210

FOREIGN PATENT DOCUMENTS

JP   2005-93049 A   4/2005
JP   2005-251378 A  9/2005
JP   2006-4479 A    1/2006

* cited by examiner

*Primary Examiner*—VanThu Nguyen
*Assistant Examiner*—R Lance Reidlinger
(74) *Attorney, Agent, or Firm*—Nixon & Vanderhye P.C.

(57) ABSTRACT

A nonvolatile semiconductor memory device comprises a memory cell array in which memory cells are arranged in a row and column direction, a circuit for applying a first voltage to a selected bit line, a circuit for applying a second voltage to unselected bit lines and word lines, a circuit for reading a current flowing in a selected memory cell, a voltage suppressor circuit for suppressing fluctuation of the second voltage with respect to each word line and bit line provided in the circuit for applying the second voltage, and a second voltage control circuit for applying the first voltage to the selected bit line and a dummy second voltage to the unselected bit lines and the word lines during the preset period and controlling the voltage suppressor circuit during a reading period so that the second voltage may fluctuate in a fluctuation direction of the first voltage.

10 Claims, 11 Drawing Sheets

NONVOLATILE SEMICONDUCTOR MEMORY DEVICE

CROSS REFERENCE TO RELATED APPLICATION

This Nonprovisional application claims priority under 35 U.S.C. §119(a) on Patent Application No. 2006-109909 filed in Japan on 12 Apr. 2006, the entire contents of which are hereby incorporated by reference.

BACKGROUND

1. Technical Field

The technical field relates to a semiconductor memory device having a cross-point type memory cell array in which a plurality of memory cells comprising variable resistive elements that store information by an electric resistance change are arranged in the direction of rows and columns respectively, and one ends of the memory cells in the same row are connected to the same selected row line and the other ends thereof in the same column are connected to the same selected column.

2. Description of the Related Art

Recently, a cross-point type semiconductor memory device (referred to as the "cross-point memory" occasionally hereinafter) in which a memory cell does not comprise a selecting element except a memory element and a memory cell array is formed such that the memory element directly connects a selected row line (referred to as the "word line" hereinafter) to a selected column line (referred to as the "bit line" hereinafter) has been developed (refer to Japanese Unexamined Patent Publication No. 2002-8369).

According to "Method of Detecting Equivalent Voltage for Resistive Cross-point Memory Cell Array" disclosed in the Japanese Unexamined Patent Publication No. 2002-8369, a predetermined voltage is supplied to each word line and bit line to detect a resistance state of the memory cell of an MRAM Magnetic Random Access Memory). According to the Japanese Unexamined Patent Publication No. 2002-8369, when a selected memory cell is read, the resistance state, that is, the memory state of the selected memory cell is detected by applying a first voltage to the selected word line and applying a second voltage lower than the first voltage, to the selected and unselected bit lines and the unselected word lines.

In addition, this cross-point memory has a hierarchy structure in which the memory cell array is divided into a plurality of banks, a local bit line of each bank is connected to a global bit line through a bank select transistor and a local word line of each bank is connected to a global word line through a bank select transistor.

FIG. 7 shows the circuit constitution of a conventional cross-point memory cell array, and set levels of supply voltages and current pathways to the word line and the bit line. According to the cross-point memory shown in FIG. 7, when a selected memory cell is read, the resistance state of the memory cell selected on the side of the word line is detected by applying a voltage V1 to a selected bit line and applying a voltage V2 higher than the voltage V1, to selected and unselected word lines and unselected bit lines.

FIG. 7 shows a case where when the resistance state of the memory cell at the crossed point between the word line D0 and the bit line B0 is read, the desired resistance state of the memory cell is determined by reading the current of the selected word line D0.

FIG. 8 shows another example of voltage setting for each word line and each bit line and current pathways when the resistance value of the memory cell positioned at the crossed point between the word line D0 and the bit line B0 is read. According to FIG. 8, similar to the voltage setting disclosed in the above Japanese Unexamined Patent Publication No. 2002-8369, when the selected memory cell is read, the resistance state of the memory cell selected on the side of the bit line is detected by applying a voltage V1 to the selected word line and applying a voltage V2 lower than the voltage V1, to the selected and unselected bit lines and the unselected word lines. In this case, the desired resistance state of the memory cell is determined by reading the current of the bit line B0.

FIG. 9 shows a current flow when a word line drive circuit to drive the word line and a bit line drive circuit to drive the bit line are connected to the memory cell array shown in FIG. 7 and the reading is executed.

According to this reading operation, a word line drive circuit shown in FIG. 10 is connected to each word line, so that the voltage V2 is applied to each word line by the word line drive circuit. Furthermore, a bit line drive circuit shown in FIG. 11 is connected to each bit line, so that the voltage V1 is applied to the selected bit line B0 connected to the selected memory cell to be read and the voltage V2 is applied to the unselected bit lines except the selected bit line B0 by the bit line drive circuit.

In addition, since all resistances (memory cells) connected to the selected bit line B0 are accessed in this reading operation, the reading current flows in all resistances connected to the selected bit line B0. The reading current flows from each word line and concentrates on the selected bit line B0 through each resistance connected to the selected bit line B0. The reading current concentrating on the selected bit line B0 is connected to the circuit to apply the voltage V1 through a bank select transistor SelB0, a switch circuit SW1 and an access bit line driver B0Dr connected to the selected bit line B0. In this case, the reading current concentrating on the selected bit line B0 raises the voltage between the source and drain of the bank select transistor SelB0 when it passes through the bank select transistor SelB0. The larger the reading current flowing in the selected bit line B0 is or the higher the ON resistance of the bank select transistor SelB0 is, the larger the rise range of the voltage is.

In the reading operation shown in FIG. 9, when the resistance values of the memory cells connected to the selected bit line B0 are all low, the reading current flowing in the selected bit line B0 is largest. Therefore, the rise range of the voltage in the bank select transistor SelB0 is largest.

Oppositely, in the reading operation shown in FIG. 9, when the resistance values of the memory cells connected to the selected bit line B0 are all high, the reading current flowing in the selected bit line B0 is smallest. Therefore, the rise range of the voltage in the bank select transistor SelB0 is smallest.

Here, it is assumed that the ratio of the resistance value when the resistance value of the memory cell is high and when the resistance value is low is 5. Furthermore, as shown in FIG. 9, when the resistance values of the memory cells connected to the selected bit line B0 are all low, it is assumed that the current value flowing in the selected bit line is set to a bit line current $I_{BOL}$. In addition, as shown in FIG. 9, when the resistance values of the memory cells connected to the selected bit line B0 are all high, it is assumed that the current value flowing in the selected bit line is set to a bit line current $I_{BOH}$. In this case, the current ratio between the bit line current $I_{BOL}$ and the bit line current $I_{BOH}$ is shown by the following formula 1.

$$I_{BOL}/I_{BOH}=5 \tag{1}$$

Therefore, when it is assumed that the bank select transistor SelB0 operates in a linear region, the voltage rise through the bank select transistor SelB0 connected to the selected bit line B0 is such that the voltage rise range $\Delta V_L$ when the resistance values of the selected memory cells are all low is $5\Delta V_H$ that is five times as large as the voltage rise range $\Delta V_H$ when the resistance values of the memory cells connected to the selected bit line B0 are all high.

When the reading operation is executed in the cross-point type memory cell array as shown in FIG. 9, the resistance value, that is, the memory state of the selected memory cell to be read is determined by measuring the current value in the word line drive circuit. However, the measured current value largely depends on the voltage applied to the selected memory cell.

When it is assumed that the voltage rise generated through the bank select transistor SelB0 and the voltage drop caused by the wiring resistance of the selected bit line are 0V in FIG. 9 or 7, the voltage level Vbiasc applied to the memory cell is as shown in the following formula 2.

$$V\text{biasc} = V2 - V1 \qquad (2)$$

However, when the resistance values of the memory cells connected to the selected bit line B0 are all low as shown in FIG. 9, since the voltage rise range $\Delta V_L$ is not 0V but $5\Delta V_H$ as described above, the voltage level Vbiasc applied to the selected memory cell is shown as the following formula 3 in an actual case.

$$V\text{biasc}1 = V2 - V1 - 5\Delta V_H \qquad (3)$$

In addition, as shown in FIG. 9, when the resistance values of the memory cells connected to the selected bit line B0 are all high, the voltage level Vbiasc2 applied to the selected memory cell is shown as the following formula 4.

$$V\text{biasc}2 = V2 - V1 - \Delta V_H \qquad (4)$$

Here, the measured current in the word line drive circuit is proportional to the voltage level applied to the memory cell. Thus, when the voltage rise range $\Delta V_H$ and $5\Delta V_H$ on the selected bit line are large enough to be compared with the voltage difference V2-V1 between the word line and the selected bit line, the voltage difference between the voltage level Vbiasc2 applied to the selected memory cell when the resistance values of the memory cells connected to the selected bit line B0 are all high, and the voltage level Vbiasc1 applied to the selected memory cell when the resistance values of the memory cells connected to the selected bit line B0 are all low is shown as the following formula 5.

$$\begin{aligned}V\text{biasc}2 - V\text{biasc}1 &= V2 - V1 - \Delta V_H - (V2 - V1 - 5\Delta V_H)\\ &= 4\Delta V_H\end{aligned} \qquad (5)$$

That is, even when the selected memory cell showing the same resistance value is accessed, the current difference proportional to the voltage difference $4\Delta V_H$ is generated as the measured current difference in the word line drive circuit, so that a reading current margin is decreased for that.

SUMMARY

In one or more embodiments of the present invention, a nonvolatile semiconductor memory device is provided that can prevent a measured current from being reduced and improve a reading margin by preventing the decrease in an applied voltage to the selected memory cell because of the rise in voltage generated in a selected bit line.

A nonvolatile semiconductor memory device embodiment comprises a memory cell array in which a plurality of two-terminal structured memory cells each having a variable resistive element for storing information according to an electric resistance change are arranged in a row and column direction, a plurality of word lines extending in the row direction and a plurality of bit lines extending in the column direction are provided, the memory cells on the same row are connected at one end to the same word line, and the memory cells on the same column are connected at the other end to the same bit line, a circuit for applying a first voltage to a selected bit line connected to a selected memory cell to be read, a circuit for applying a second voltage to the word lines and unselected bit lines except the selected bit line, a circuit for reading a current flowing in the selected memory cell from the side of a selected word line connected to the selected memory cell based on a voltage difference applied to the selected memory cell, a voltage suppressor circuit for suppressing the fluctuation of the second voltage with respect to each word line and bit line provided in the circuit for applying the second voltage, and a second voltage control circuit for applying a predetermined voltage to the selected bit line and a dummy second voltage to the unselected bit lines and the word lines, detecting fluctuation of a voltage of the selected bit line depending on a data pattern stored in the memory cell array during a preset period set prior to a reading period to detect the current flowing in the selected memory cell, and controlling the voltage suppressor circuit during the reading period so that the second voltage may fluctuate in a direction of the fluctuation which is detected, as a first characteristic.

The nonvolatile semiconductor memory device of the above characteristic is characterized in that the second voltage control circuit comprises a detection circuit for detecting a fluctuation range of the voltage of the selected bit line which fluctuates depending on the data pattern stored in the memory cell array, as a second characteristic.

The nonvolatile semiconductor memory device of the above characteristics is characterized in that the second voltage control circuit comprises a memory circuit for storing the fluctuation range detected by the detection circuit during the preset period and controls the voltage suppressor circuit based on the fluctuation range stored in the memory circuit, as a third characteristic.

The nonvolatile semiconductor memory device of the above characteristics is characterized in that the memory circuit comprises a capacitor for storing a voltage level according to the fluctuation range, as a fourth characteristic.

The nonvolatile semiconductor memory device of the above characteristics is characterized in that the voltage level varies in a direction opposite to a fluctuation direction of the voltage of the selected bit line, as a fifth characteristic.

The nonvolatile semiconductor memory device of the fourth or fifth characteristic is characterized in that the second voltage control circuit comprises a current amplifier for amplifying a current of the voltage level and output it, as a sixth characteristic.

The nonvolatile semiconductor memory device of any of the fourth to sixth characteristics is characterized in that the voltage suppressor circuit comprises a MOS transistor whose one end is connected to the bit line and whose other end is connected to a supply side of the second voltage, and an inverter circuit whose input side is connected to the bit line and whose output side is connected to a gate of the MOS transistor and controls an inversion level of the inverter circuit depending on the voltage level stored in the capacitor, as a seventh characteristic.

In one or more embodiments, since the voltage applied to the word line is controlled so as to be fluctuated in the same direction as the voltage fluctuation on the selected bit line during the preset period, the voltage difference between the selected bit line and word line during the reading period, that is, the fluctuation of the voltage applied to both ends of the selected memory cell depending on the data pattern of the resistance value of the other memory cell on the selected bit line is suppressed. As a result, the affect on the reading current can be suppressed and the reading margin is increased. Furthermore, since the unselected bit line is adjusted similarly, the voltage difference is not generated between the word line and the unselected bit line, so that an unnecessary leak current can be prevented.

DETAILED DESCRIPTION

A nonvolatile semiconductor memory device according to an embodiment of the present invention (referred to as the "embodied device" occasionally hereinafter) will be described with reference to the drawings hereinafter.

Figure 1:
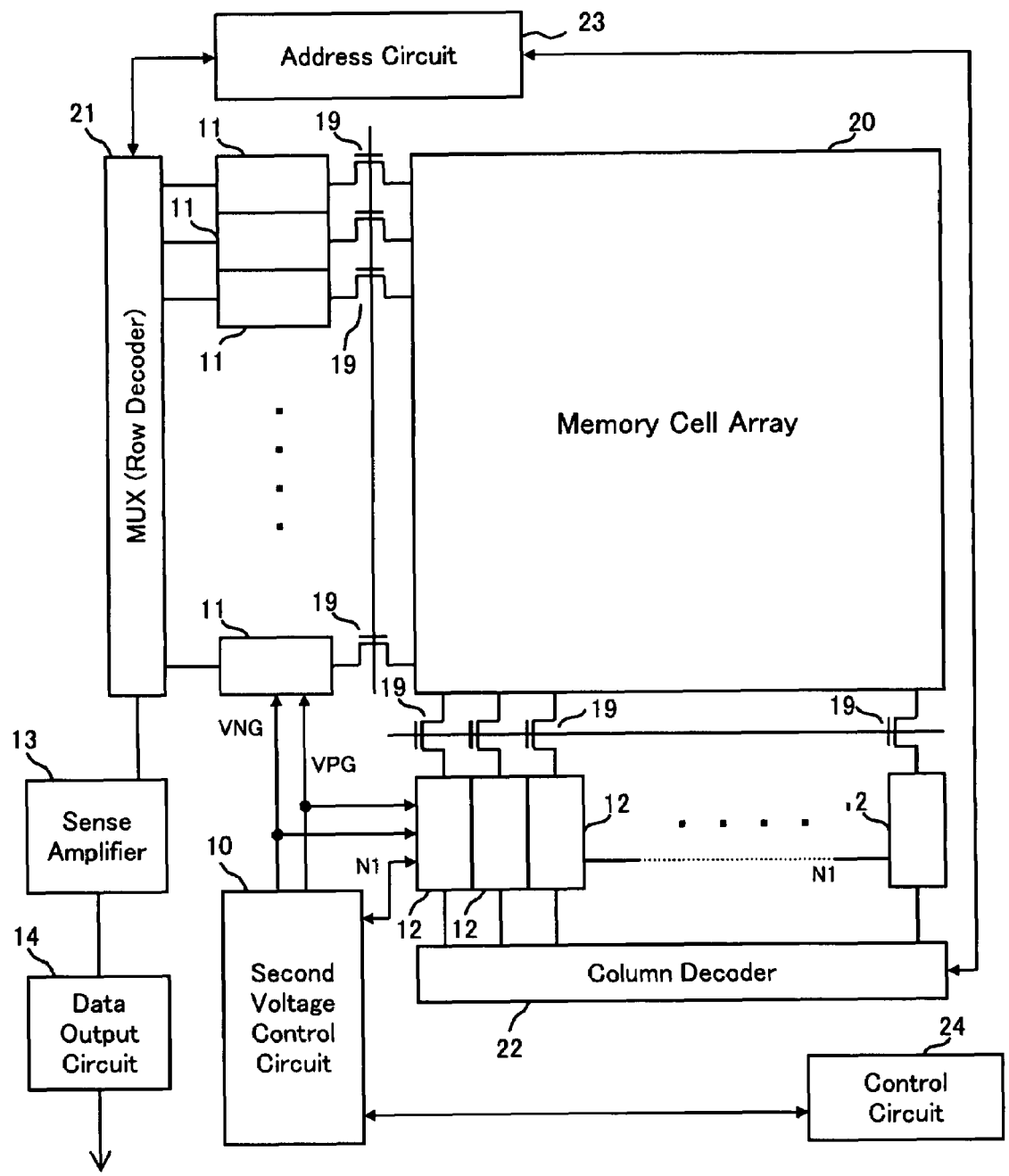
FIG. 1 is a schematic circuit diagram showing the schematic constitution of a nonvolatile semiconductor memory device according to an embodiment of the present invention.

The device according to this embodiment will be described with reference to FIGS. 1 to 6. FIG. 1 shows an example of the main constitution of the embodied device, a memory cell array and its peripheral circuits. The memory cell array has a cross-point structure in which a plurality of two-terminal structured memory cells (not shown) each having a variable resistive element for storing information according to an electric resistance change are arranged in a row and column direction, a plurality of word lines extending in the row direction and a plurality of bit lines extending in the column direction are provided, each of the memory cells on the same row is connected at one end to the same word line, and each of the memory cells on the same column is connected at the other end to the same bit line. The memory cell array in this embodiment has a hierarchy structure comprising a plurality of divided banks in which a local bit line of each bank is connected to a global bit line through a bank select transistor 19 and a local word line of each bank is connected to a global word line through the bank select transistor 19.

As shown in FIG. 1, a word line drive circuit 11 to supply a voltage V2 (the second voltage) to each word line is connected to the memory cell array through the bank select transistor 19. In addition, a bit line drive circuit 12 to supply a voltage V1 (the first voltage) to a selected bit line connected to a selected memory cell to be read, and supply the voltage V2 to unselected bit lines other than the selected bit line is connected to the memory cell array. Furthermore, the embodied device comprises a row select circuit MUX (row decoder 21) to select the output from the word line drive circuit 11 connected to the selected word line connected to the selected memory cell, a sense amplifier 13 to amplify the output from the row decoder 21, a data output circuit 14, and a second voltage control circuit 10 to regulate the voltage V2.

Figure 2:
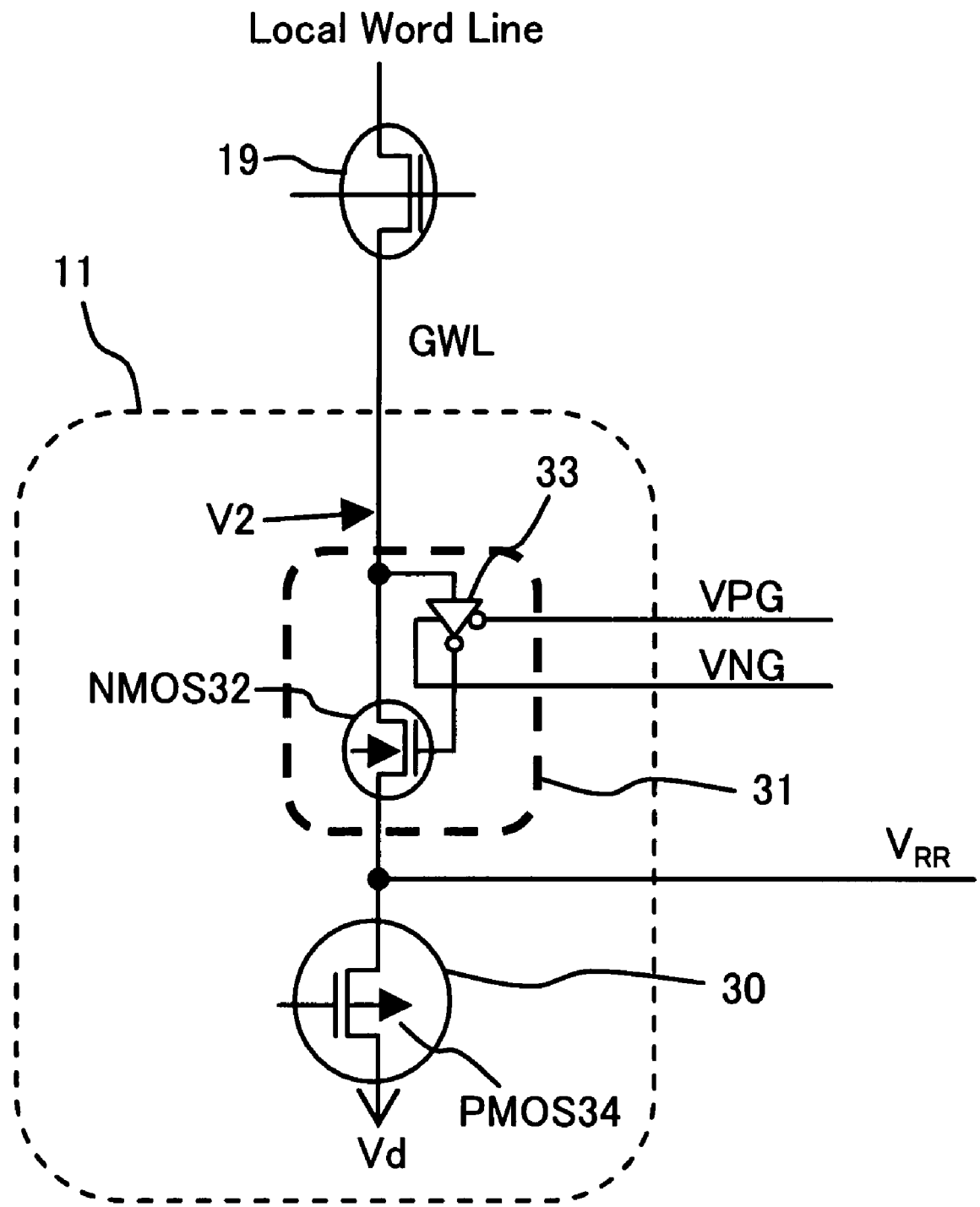
FIG. 2 is a schematic circuit diagram showing the schematic constitution of a word line drive circuit of the nonvolatile semiconductor memory device according to an embodiment of the present invention.

The word line drive circuit 11 is provided for each word line and comprises a row readout voltage supply circuit 30 to supply a row readout voltage Vd (power supply voltage Vcc, for example) at the time of reading, and a voltage suppressor circuit 31 to suppress the displacement of a voltage level supplied from the row readout voltage supply circuit 30 as shown in FIG. 2. The second voltage V2 whose voltage fluctuation is suppressed by the voltage suppressor circuit 31 is supplied to each word line.

The row readout voltage supply circuit 30 comprises a P-channel MOSFET (referred to as the "PMOS" simply hereinafter) 34 in which the source is connected to the row readout voltage Vd, the drain is connected to the voltage suppressor circuit 31, and the gate voltage is set to be fixed at a predetermined voltage level so that the PMOS may operate in a saturated region.

Figure 3:
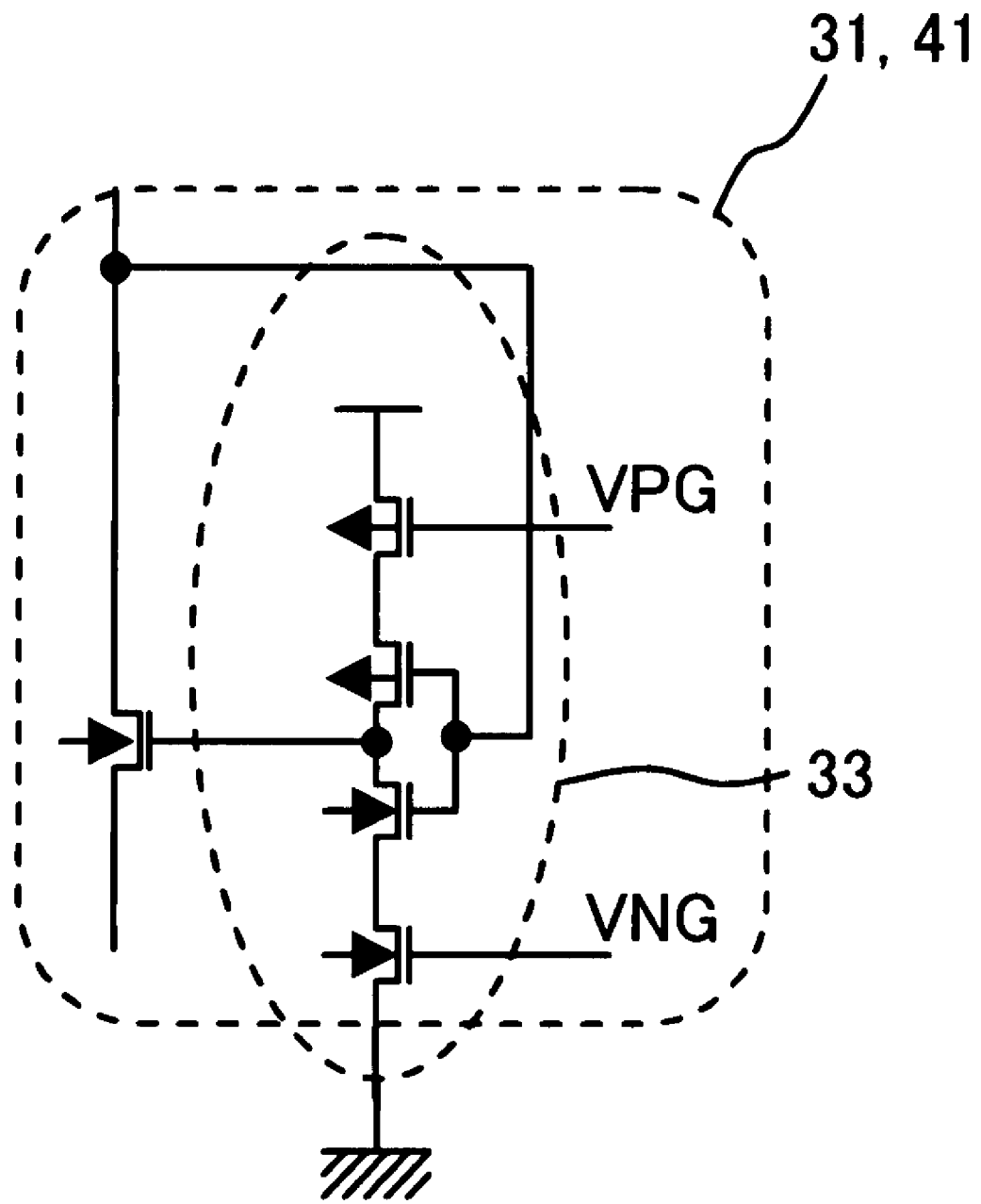
FIG. 3 is a schematic circuit diagram showing the schematic constitution of a voltage suppressor circuit of the nonvolatile semiconductor memory device according to an embodiment of the present invention.

The voltage suppressor circuit 31 comprises a feedback circuit unit comprising a N-channel MOSFET (referred to as the "NMOS" simply hereinafter) 32 whose source is connected to a global word line GWL and whose drain is connected to the row readout voltage supply circuit 30, and an inverter 33 whose input is connected to the word line and whose output is connected to the gate of the NMOS 32. According to this constitution, the feedback circuit unit adjusts the ON resistance of the NMOS 32 by varying the gate voltage of the NMOS 32 according to the voltage level V2 of the global word line GWL. FIG. 3 shows the detailed constitution of the voltage suppressor circuit 31. In the feedback circuit unit (shown by a broken line), an NMOS having the gate to which a VNG signal outputted from the second voltage control circuit 10 is inputted is connected to the drain side (ground voltage side) of the NMOS of the inverter 33, and a PMOS having the gate to which a VPG signal outputted from the second voltage control circuit 10 is inputted is connected to the source side (power supply side) of the PMOS of the inverter 33.

The row decoder 21 selects the memory cell in the row direction by selecting a readout voltage $V_{RR}$ from the word line drive circuit 11 based on the signal from an address circuit 23.

Figure 4:
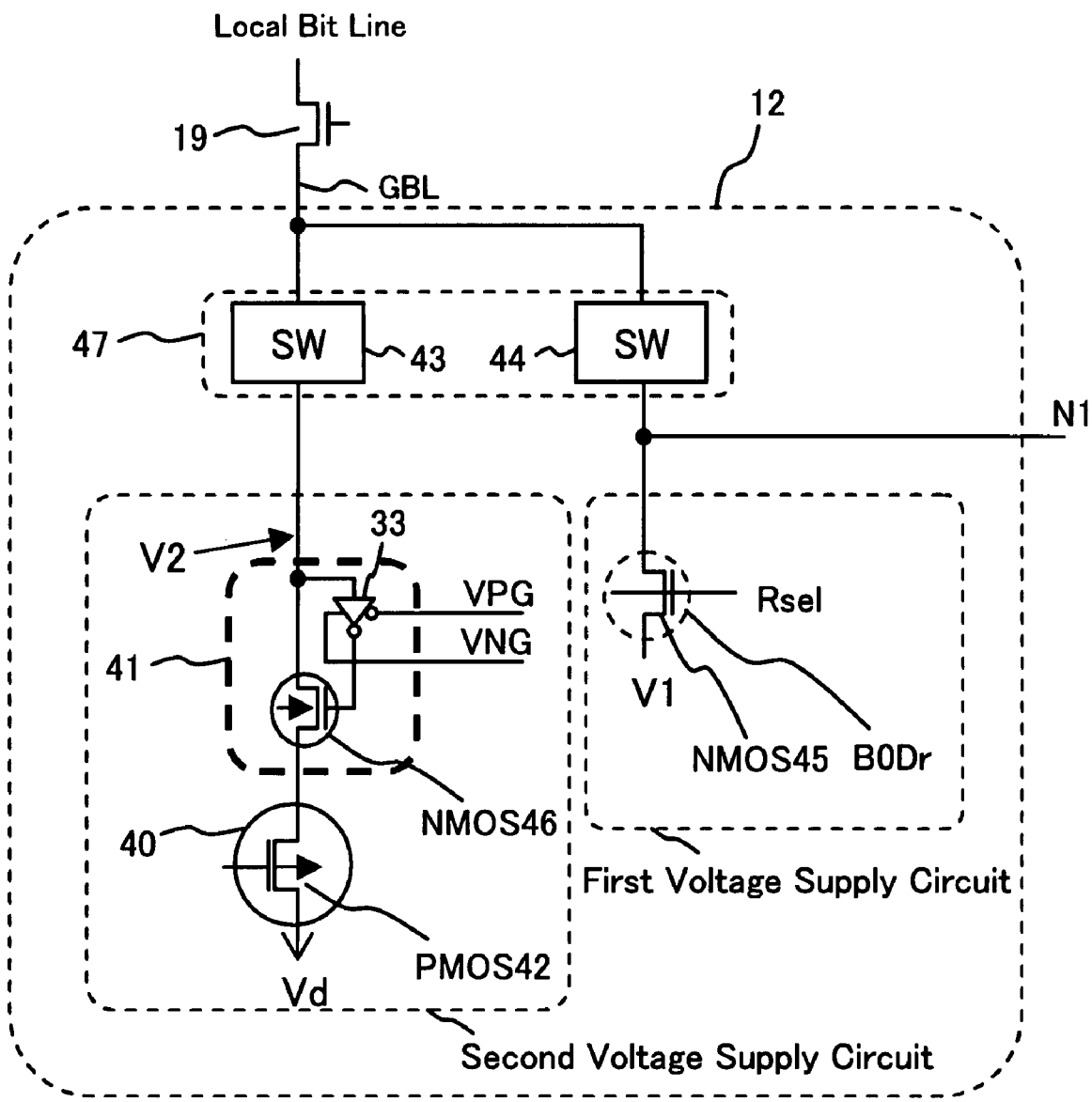
FIG. 4 is a schematic circuit diagram showing the schematic constitution of a bit line drive circuit of the nonvolatile semiconductor memory device according to an embodiment of the present invention.

The bit line drive circuit 12 is provided for each bit line as shown in FIG. 4, and it is connected to the bank select transistor 19 connected to each bit line through the global bit line. As shown in FIG. 4, the bit line drive circuit 12 comprises a first voltage supply circuit to supply a predetermined first voltage V1 at the time of reading when the bit line is selected, that is, to the selected bit line, a second voltage supply circuit to supply a predetermined second voltage V2 at the time of reading when the bit line is not selected, that is, to the unselected bit line, and a column selecting circuit 47 selectively connecting the first voltage supply circuit or the second voltage supply circuit to the bit line.

The first voltage supply circuit comprises an access bit line driver B0Dr to supply the first voltage V1.

The second voltage supply circuit comprises a column readout voltage supply circuit 40 to supply the column readout voltage Vd (power supply voltage Vcc, for example) to the unselected bit line, and a voltage suppressor circuit 41 to suppress the displacement of the voltage level supplied from the column readout voltage supply circuit 40 to the second voltage V2. The second voltage V2 whose voltage fluctuation is suppressed is supplied to each unselected bit line by the voltage suppressor circuit 41.

The column readout voltage supply circuit 40 comprises a PMOS 42 in which the source is connected to the column readout voltage Vd, the drain is connected to the voltage suppressor circuit 41, and the gate voltage is set to be fixed at a predetermined voltage level so that the PMOS 42 may operate in a saturated region.

As shown in FIGS. 3 and 4, the voltage suppressor circuit 41 comprises a feedback circuit comprising an NMOS 46 whose source is connected to a CMOS transfer gate 43 and whose drain is connected to the column readout voltage supply circuit 40, and an inverter 33 to vary the gate voltage of the NMOS 46 according to the voltage level V2 of the bit line and adjust the ON resistance of the NMOS 46. The feedback circuit has the same constitution as that of the feedback circuit of the voltage suppressor circuit 31. In addition, the second voltage supplied to the unselected bit line has the same voltage level as that of the second voltage supplied to the word line.

As shown in FIG. 4, the column select circuit 47 comprises a pair of CMOS transfer gates 43 and 44. One end of the CMOS transfer gate 43 is connected to the voltage suppressor circuit 41 and the other end thereof is connected to the global bit line GBL. One end of the CMOS transfer gate 44 is connected to the access bit line driver B0Dr (NMOS 45) to supply the first voltage V1, and the other end thereof is connected to the global bit line GBL. When the connected global bit line GBL is the global bit line GBL selected by the column decoder, the column select circuit 47 turns on the CMOS transfer gate 44 on the right side and supplies the first voltage V1 to the bit line. When the connected bit line is the global bit line GBL that is not selected by a column decoder 22, it turns on the CMOS transfer gate 43 on the left side and supplies the second voltage V2 through the PMOS 42 and the voltage suppressor circuit 41.

The column decoder 22 turns on one of the CMOS transfer gates 43 and 44 and turns off the other thereof with respect to each bit line based on the signal from the address circuit 23 to control the selection and unselection of the memory cell in the column direction and control the voltage of each bit line based on the bit line drive circuit 12.

Figure 5:
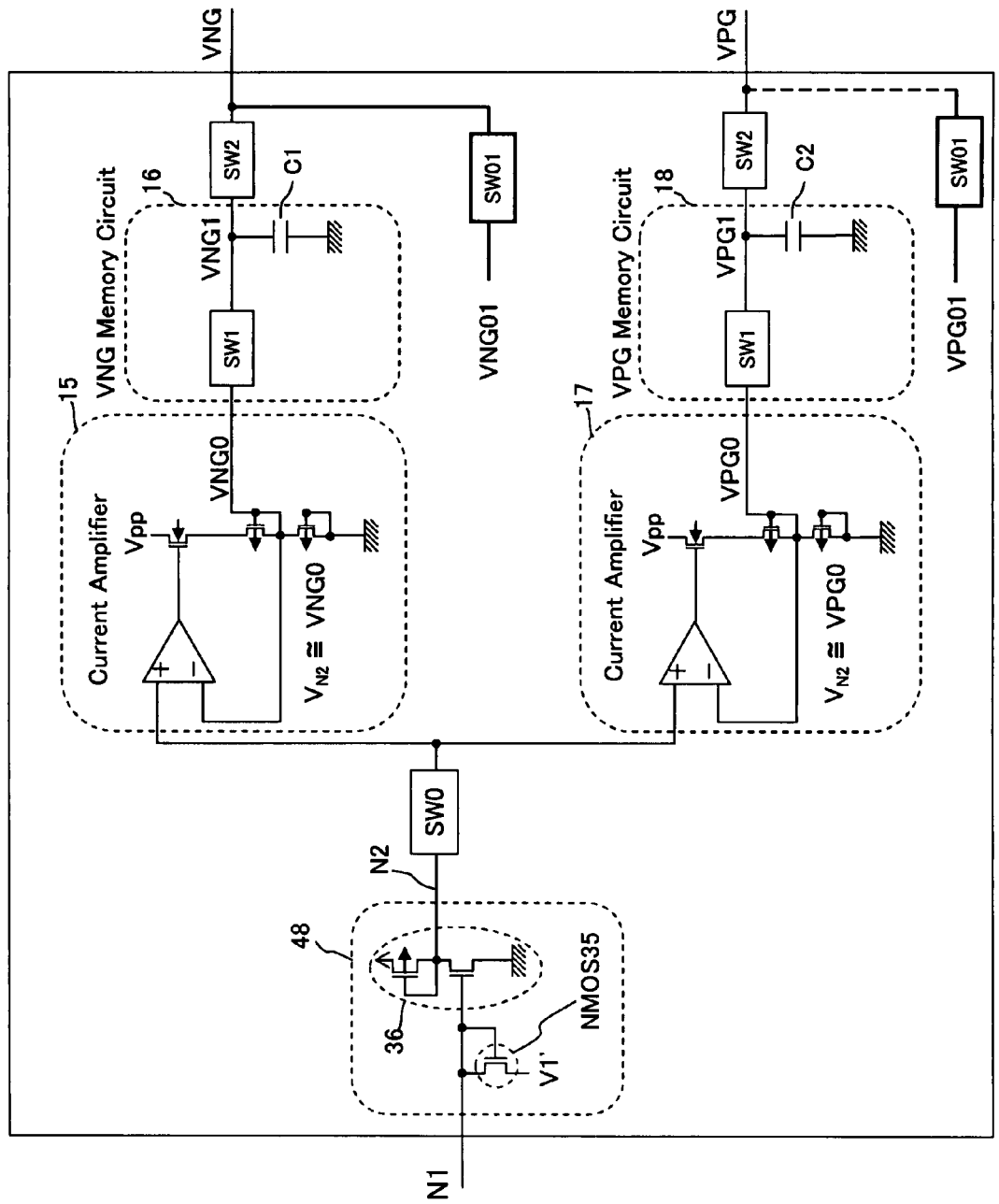
FIG. 5 is a schematic circuit diagram showing the schematic constitution of a second voltage control circuit of the nonvolatile semiconductor memory device according to an embodiment of the present invention.

As shown in FIG. 5, the second voltage control circuit 10 comprises a detection circuit 48 to detect a fluctuation range of the voltage on the selected bit line fluctuating depending on the data pattern stored in the memory cell array, current amplifiers 15 and 17 to amplify the current of the signal outputted from the bit line drive circuit 12 and output it, a VNG memory circuit 16 to hold the output of the current amplifier 15 during a preset period, and a VPG memory circuit 18 to hold the output of the current amplifier 17 during the preset period, and it is connected to the control circuit 24.

As shown in FIG. 5, the detection circuit 48 comprises an NMOS 35 and an inverter 36 that are diode-connected. The drain and gate of the NMOS 35 are connected to a node N1 and the source thereof is connected to a voltage V1' (ground voltage, for example). The inverter 36 comprises a PMOS whose gate and drain are connected to the output of the inverter 36 and whose source is connected to the power supply voltage, and an NMOS whose gate, drain and source are connected to the input of the inverter 36, the output of the inverter 36 and ground voltage, respectively. The input of the inverter 36 is connected to the access bit line driver B0Dr, and the output thereof is connected to a switch circuit SW0 through a node N2. The inverter 36 detects the fluctuation range of the voltage of the selected bit line fluctuating depending on the data pattern stored in the memory cell array during the preset period as will be described below, as the voltage fluctuation range of the node N1, and inverts the detected voltage level so as to vary in the direction opposite to the fluctuation direction of the voltage of the node N1 and outputs it to the node N2.

As shown in FIG. 5, the current amplifier 15 comprises an operating amplifier and it is connected to the detection circuit 48 through the switch circuit SW0 and amplifies the current of the voltage level $V_{N2}$ of the node N2 inverted so as to vary in the direction opposite to the fluctuation direction of the voltage of the selected bit line in the detection circuit 48 and outputs an inverted amplified signal VNG0. The current amplifier 15 enhances the current supply ability to supply an electric charge to a capacitor C1 of the VNG memory circuit 16 connected to the next stage.

As shown in FIG. 5, the VNG memory circuit 16 holds the fluctuation range detected by the detection circuit 48 during the preset period. According to this embodiment, the VNG memory circuit 16 comprises a switch circuit SW1 and the capacitor C1 and holds the inverted amplified signal VNG0 outputted from the current amplifier 15 in the capacitor C1. The output of the VNG memory circuit 16 is connected to a switch circuit SW2. When the switch circuit SW2 is turned on and the switch circuit SW01 is turned off at the reading after the preset period has elapsed, the voltage level of a VNG1 signal is outputted to a VNG line. The capacitance of the capacitor C1 is to be set so as to be considerably larger than the wiring capacitance of the subsequent VNG line and the total of the gate capacitance of the inverters in the word line drive circuit 11 and the bit line drive circuit 12 connected to the VNG line. Therefore, the voltage drop in the voltage level of the VNG1 signal in the VNG memory circuit 16 due to charge sharing generated when the switch circuit SW2 is turned on at the time of reading operation can be ignored.

As shown in FIG. 5, the current amplifier 17 has the same circuit constitution as that of the current amplifier 15 in this embodiment and it comprises an operating amplifier and it is connected to the detection circuit 48 through the switch circuit SW0 and amplifies the current of the voltage level $V_{N2}$ of the node N2 inverted so as to vary in the direction opposite to the fluctuation direction of the voltage of the selected bit line in the detection circuit 48 and outputs an inverted amplified signal VPG0. The current amplifier 17 enhances the current supply ability to supply an electric charge to a capacitor C2 of the VPG memory circuit 18 connected to the next stage.

As shown in FIG. 5, the VPG memory circuit 18 has the same circuit constitution as that of the VNG memory circuit 16 in this embodiment, and it holds the fluctuation range detected by the detection circuit during the preset period. The VPG memory circuit 18 comprises a switch circuit SW1 and the capacitor C2 and holds the inverted amplified signal VPG0 outputted from the current amplifier 17 in the capacitor C2. The output of the VPG memory circuit 18 is connected to a switch circuit SW2. When the switch circuit SW2 is turned on and the switch circuit SW01 is turned off at the time of reading after the preset period has elapsed, the voltage level of a VPG1 signal is outputted to a VPG line. The capacitance of the capacitor C2 is to be set so as to be considerably larger than the wiring capacitance of the subsequent VPG line and the total of the gate capacitance of the inverters in the word line drive circuit 11 and the bit line drive circuit 12 connected to the VPG line. Therefore, the voltage drop in the voltage level of the VPG1 signal in the VPG memory circuit 18 due to charge sharing generated when the switch circuit SW2 is turned on at the time of reading operation can be ignored.

According to the above constitution, when the VNG signal and the VPG signal are fluctuated during the readout period, the voltages between the gates and the sources of the PMOS and NMOS receiving the VPG signal and the VNG signal of the inverter 33 of the voltage suppressor circuit 31 as gate inputs, respectively are relatively fluctuated, so that the inversion level of the inverter 33 can be fluctuated in the same direction as that of the first voltage V1 connected to the selected bit line, and the voltage of the word line and the unselected bit line suppressed by the voltage suppressor circuit 31 can be fluctuated in the same direction as that of the selected bit line.

Next, the operation of the embodied device and its peripheral circuits will be described with reference to FIG. 6. According to this embodiment, when a chip enable signal /CE to activate the embodied device falls, the reading operation of the memory is started. The reading operation is executed during the preset period and during the reading period following the preset period separately. When the reading operation is started, the switch circuits SW0, SW1, SW2, SW01 are OFF.

Figure 9:
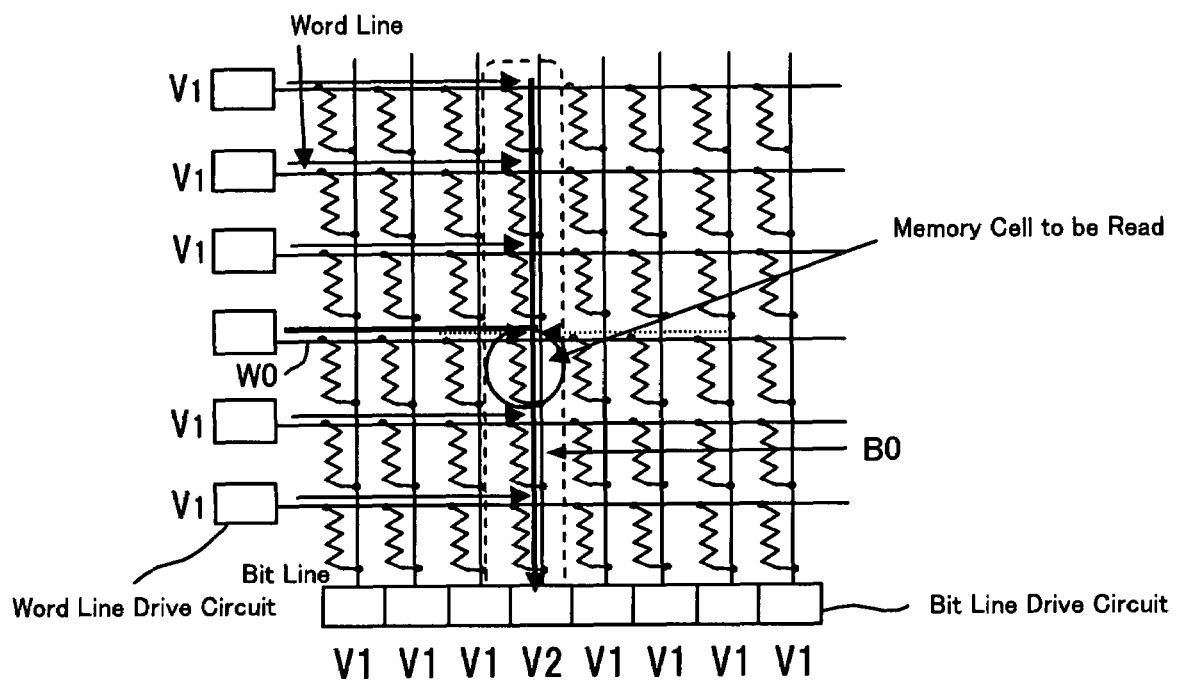
FIG. 9 is a schematic circuit diagram showing the constitution of the memory cell array according to the conventional technique.
Figure 10:
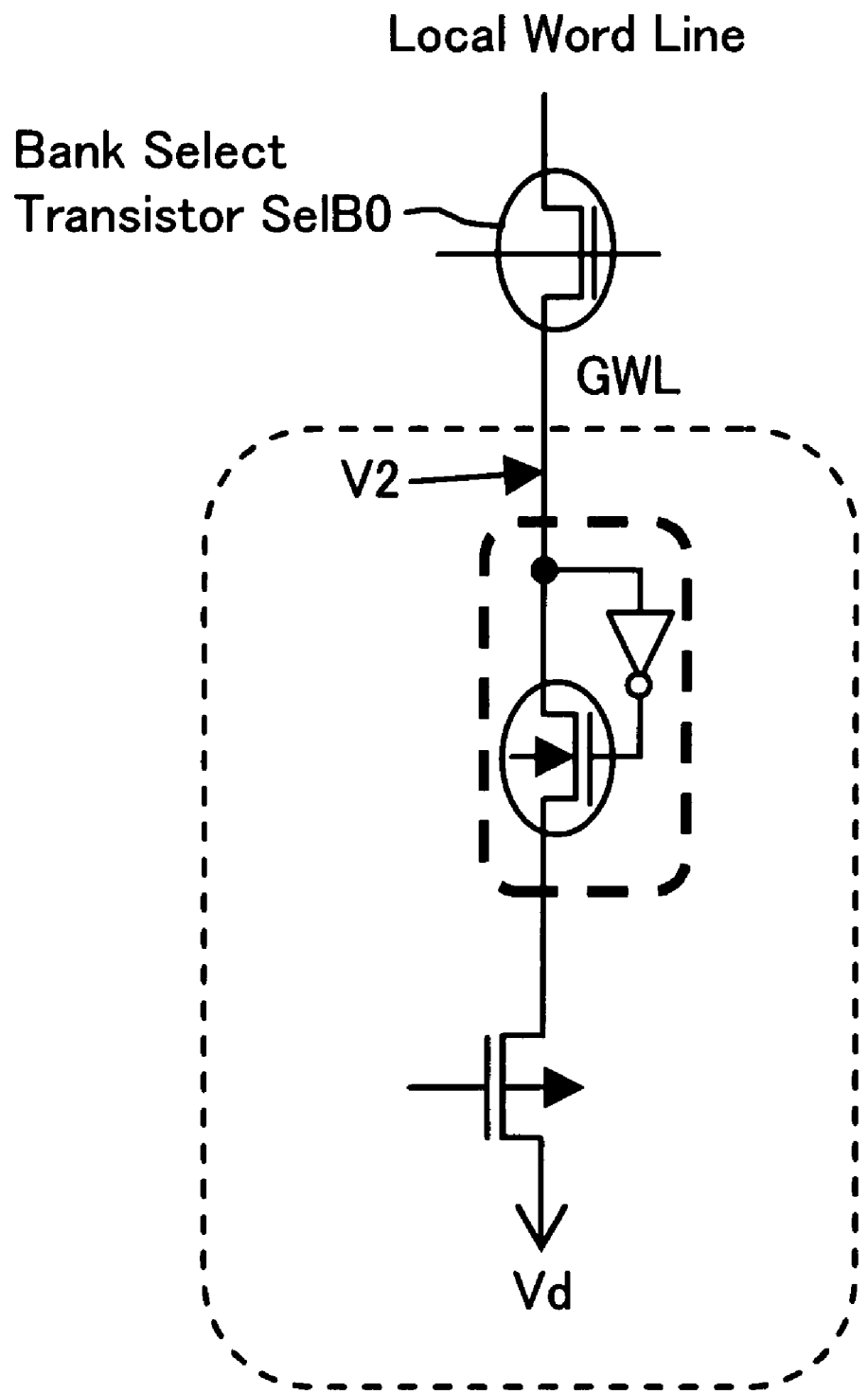
FIG. 10 is a schematic circuit diagram showing the constitution of a word line drive circuit according to the conventional technique.
Figure 11:
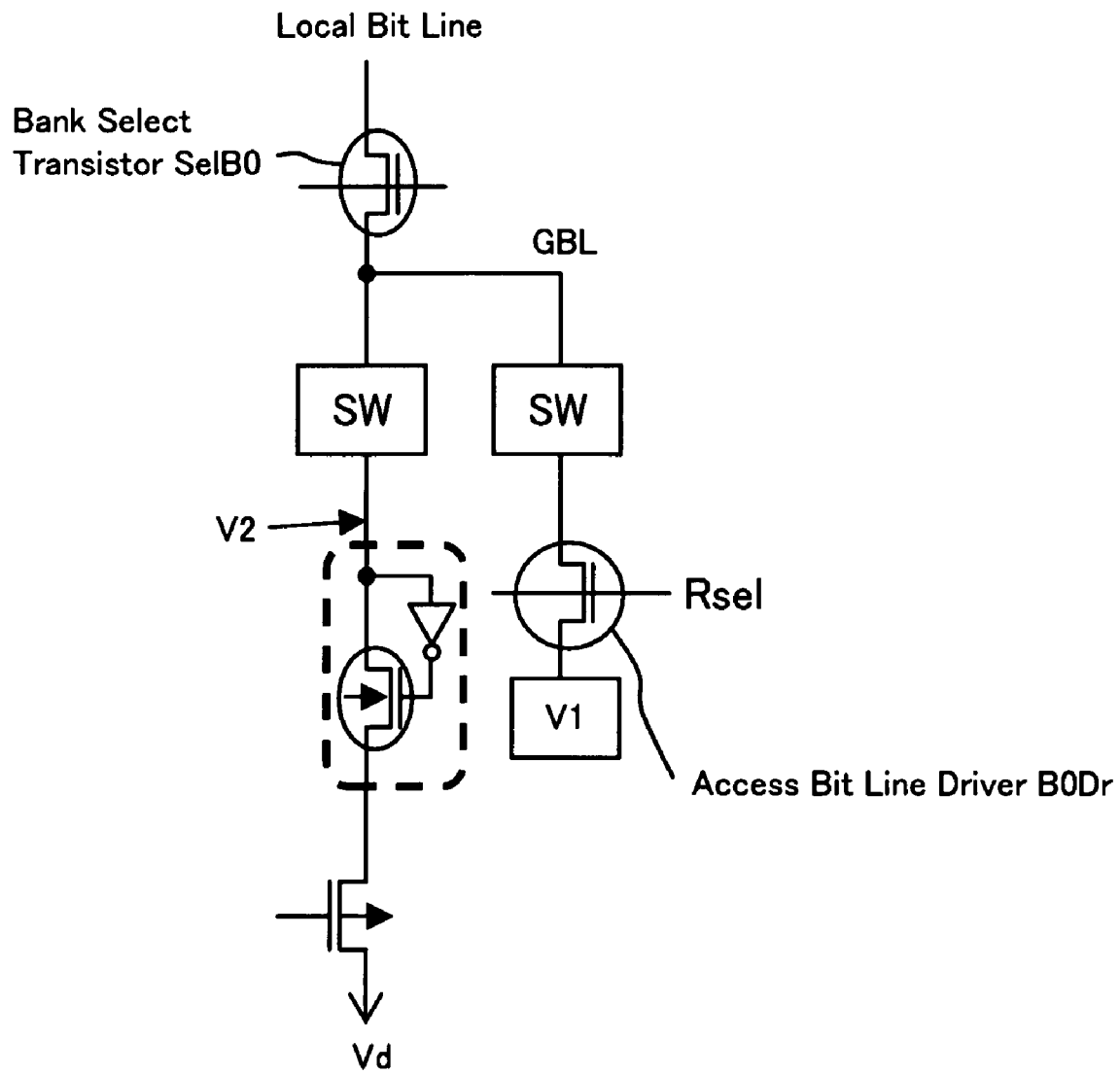
FIG. 11 is a schematic circuit diagram showing the constitution of a bit line drive circuit according to the conventional technique.

When the signal /CE falls and the preset period is started, a gate signal Rsel of the NMOS 45 of the access bit line driver B0Dr shown in FIG. 4 is set to L level (ground voltage level, for example) and the NMOS 45 is turned off. When the NMOS 45 of the access bit line driver B0Dr is turned off, the selected bit line current flows from the bank select transistor 19 to a voltage V1' (ground voltage level) through the switch circuit SW44 and the node N1 and the NMOS 35 shown in FIG. 5. At this time, the voltage level $V_{N1}$ of the node N1 is extracted by the detection circuit 48. In addition, as shown in the conventional technique in FIG. 9, when the resistance values of all the memory cells connected to the selected bit line are low, the current flowing in the selected bit line is largest and the voltage rise on the selected bit line reaches the maximum and the rise in the voltage $V_{N1}$ of the drain and gate of the NMOS 35 shown in FIG. 5 becomes high. That is, the rise in the voltage $V_{N1}$ of the node N1 becomes highest. In addition, as shown in the conventional technique in FIG. 9, when the resistance values of all the memory cells connected to the selected bit line are high, the current flowing in the selected bit line is the smallest and the voltage rise on the selected bit line reaches the minimum and the voltage $V_{N1}$ of the drain and gate of the NMOS 35 shown in FIG. 5 becomes lowest. That is, the rise in the voltage $V_{N1}$ of the node N1 becomes lowest. Therefore, the rise range of the first voltage V1 applied to the selected bit line depending on the data pattern is proportional to the fluctuation range of the voltage $V_{N1}$ at the time of the reading operation.

When the switch circuit SW01 is turned on during the preset period, initialized VNG01 signal and VPG01 signal are supplied to the word line drive circuit 11 and the bit line drive circuit 12 through the VNG line and the VPG line. The voltage levels of the VNG01 signal and the VPG01 signal can be set arbitrarily, so that the voltage levels of the word line and the unselected bit line during the preset period can be set arbitrarily. When the switch circuit SW0 is turned on, the voltage level $V_{N2}$ of the node N2 that is the inversion level of the voltage level $V_{N1}$ of the node N1 is outputted from the switch circuit SW0 to the current amplifiers 15 and 17.

Continuously, the current amplifiers 15 and 17 generate the inverted amplified signals VNG0 and VPG0 whose current was amplified. More specifically, the voltage level $V_{N2}$ of the node N2 is inputted to the + inputs of the operating amplifiers in the current amplifier 15, 17 and the VNG0 and VPG0 signals are inputted to the – inputs of the operating amplifiers respectively so that the voltage levels of the inputs become the same level as the voltage level $V_{N2}$ of the node N2. Thus, as shown in formula 6, the voltage level of the node N2, the voltage level $V_{NG0}$ of the inverted amplified signal VNG0 in the current amplifier 15, and the voltage level $V_{PG0}$ of the inverted amplified signal VPG0 in the current amplifier 17 become the same.

$$V_{N2} \cong V_{NG0} \cong V_{PG0} \quad (6)$$

Continuously, when the switch circuits SW1 of the VNG memory circuit 16 and the VPG memory circuit 18 are turned on, the voltage VNG0 of the inverted amplified signal VNG0 from the current amplifier 15 is stored in the capacitor C1 of the VNG memory circuit 16 and the voltage VPG0 of the inverted amplified signal VPG0 from the current amplifier 17 is stored in the capacitor C2 of the VPG memory circuit 18.

Then, when the reading period is started, and the switch circuits SW0 and SW1 are turned off and the switch circuit SW2 is turned on, the VNG1 signal at the voltage level $V_{NG0}$ stored in the capacitor C1 of the VNG memory circuit 16 and the VPG1 signal at the voltage level $V_{PG0}$ stored in the capacitor C2 of the VPG memory circuit 18 are supplied to the feedback circuits of the voltage suppressor circuits 31 and 41 through the VNG line and the VPG line, respectively to raise the voltage level of the word line and the voltage level of the unselected bit line by the voltage rise range of the selected bit line at the time of reading operation for adjustment, so that the inversion level in the inverter of the feedback circuit can be adjusted. In addition, when the switch circuits SW0 and SW1 are turned off at the time of the reading operation (while the switch circuit SW2 is ON), the voltage level of the node N2 that newly generated at the time of reading operation is stored in the capacitor and the updated voltage levels $V_{NG0}$ and $V_{PG0}$ are prevented from being supplied to the feedback circuits in the voltage suppressor circuits 31 and 41, respectively. Therefore, the VPG01 signal and the VNG01 signal for the preset period are used during the preset period.

Figure 6:
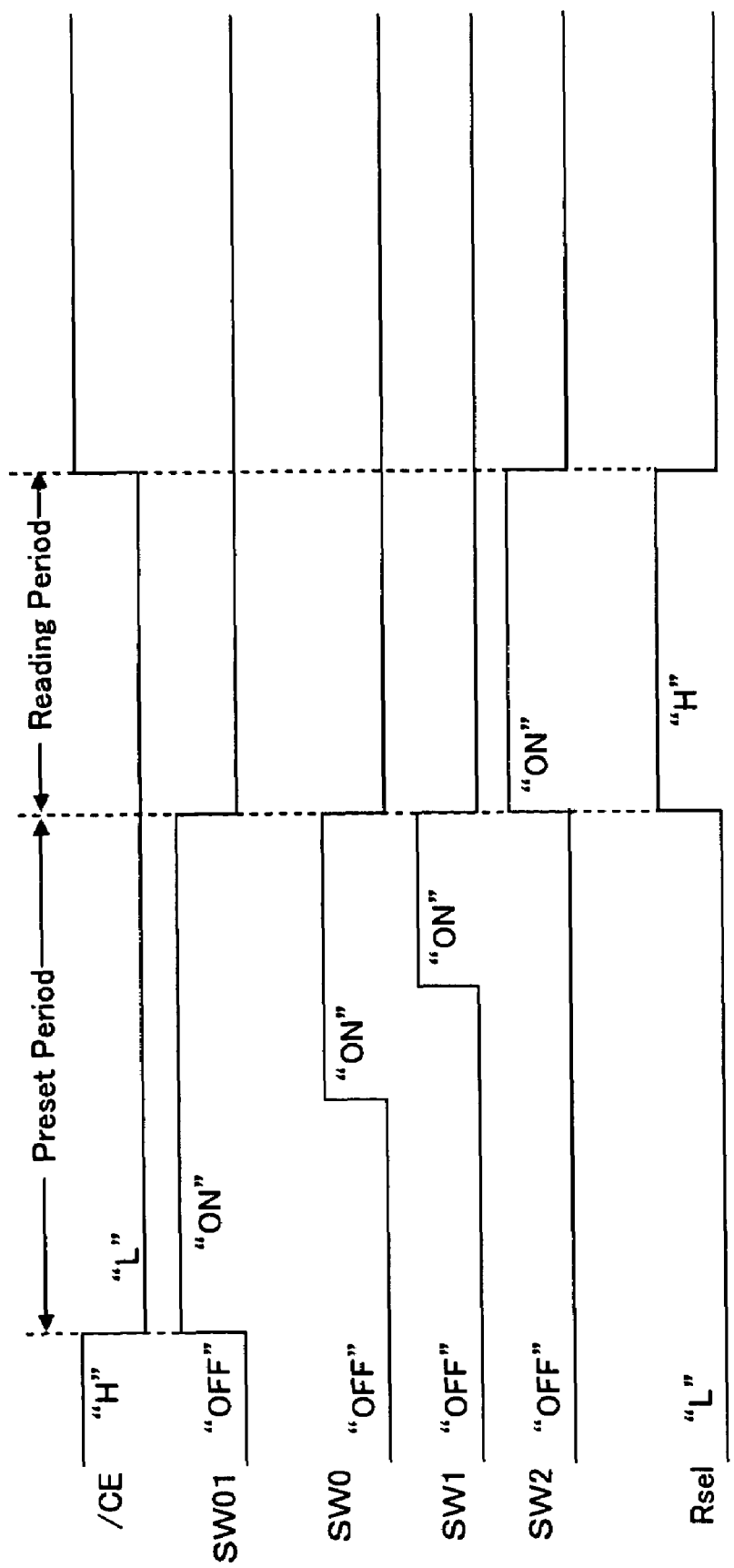
FIG. 6 is a timing chart showing an operation timing of the nonvolatile semiconductor memory device according to an embodiment of the present invention.
Figure 7:
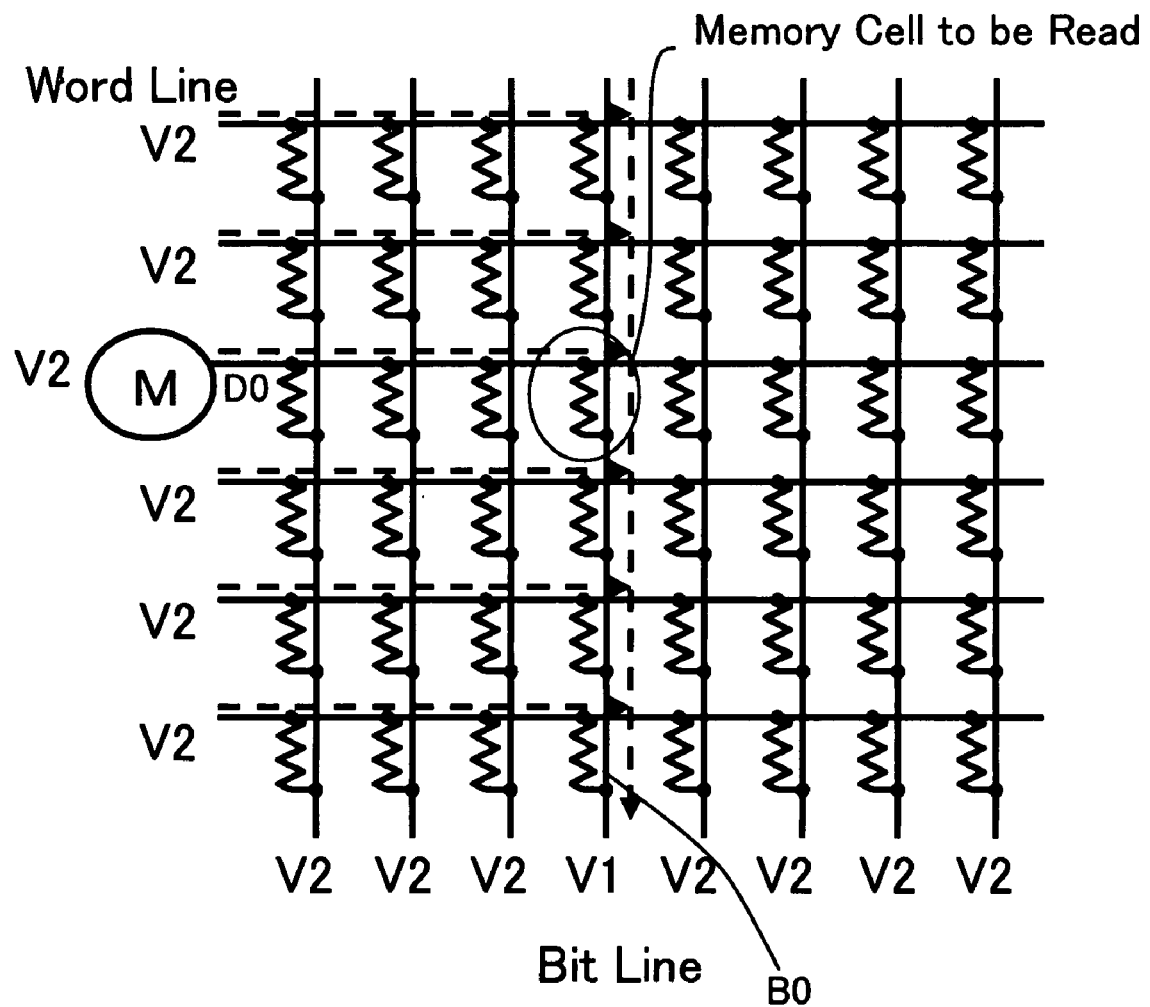
FIG. 7 is a circuit diagram showing the schematic circuit constitution of a memory cell array having a cross-point structure according to a conventional technique.
Figure 8:
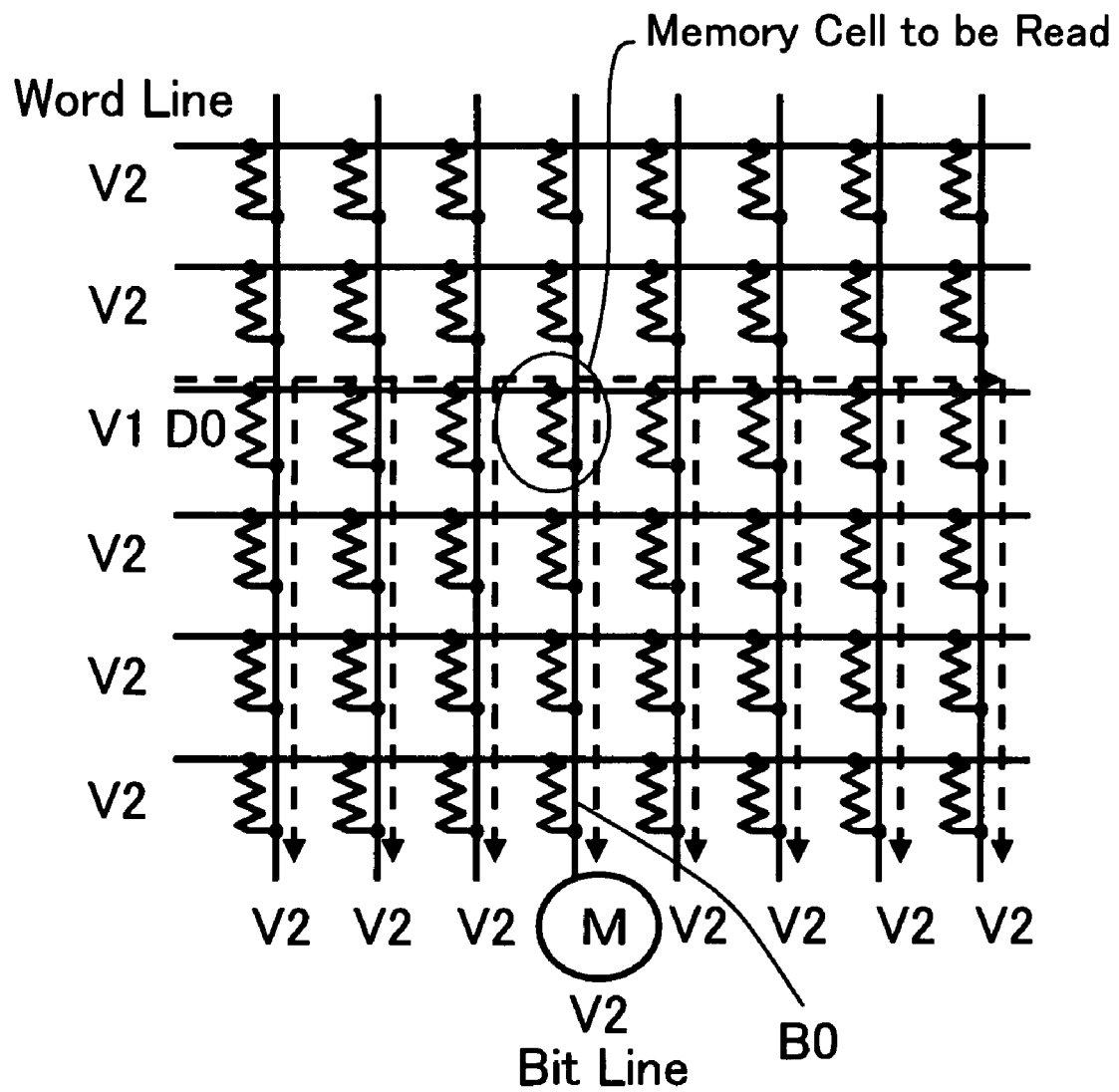
FIG. 8 is the circuit diagram showing the schematic circuit constitution of the memory cell array having the cross-point structure according to the conventional technique.

In addition, as shown in FIG. 6, after the reading period has been started and the preparation for generating the desired voltage level for the word line and the unselected bit line has been completed, the level of the gate signal Rsel of the NMOS 45 of the access bit line driver B0Dr to supply the first voltage V2 in the bit line drive circuit 12 is set to H level (power supply voltage level, for example) and the first voltage V1 is supplied to the selected bit line. Under this condition, the reading operation for the desired memory cell is executed.

As a result, the inversion levels of the inverters in the feedback circuits of the voltage suppressor circuits 31 and 41 of the word line drive circuit 11 and the bit line drive circuit 12 are adjusted by the VNG1 signal and the VPG1 signal generated based on the voltage level $V_{N1}$ of the node N1 extracted during the preset period (proportional to the current amount flowing in the selected bit line), whereby the voltage level of the word line and the unselected bit line is adjusted according to the voltage fluctuation of the selected bit line.

More specifically, when the resistance value of all the memory cells connected to the selected bit line are small, the current flowing in the selected bit line is the largest and the voltage level $V_{N1}$ at the node N1 becomes the highest. Therefore, the voltage level $V_{N2}$ at the node N2 that is the inversion level of the voltage level $V_{N1}$ at the node N1 becomes lowest. Thus, the VNG1 signal and the VPG1 signal are formed based on the voltage level $V_{N2}$, the VNG signal is inputted to the gate of the NMOS and the VPG signal is inputted to the gate of the PMOS connected to the inverters 33 in the feedback circuits (row voltage displacement suppressor circuit 31 and the column voltage displacement suppressor circuit 41) in the word line drive circuit 11 and the bit line drive circuit 12, whereby the voltage level of the all the word lines and unselected bit lines becomes high.

Here, when it is assumed that the voltage rise level of the selected bit line is $5\Delta V_H$, the voltage level applied to the memory cell to be read can be kept at a constant value by adjusting the voltage rise level of the word line and unselected bit line so as to be the same as $5\Delta V_H$. In this case, since the voltage rise level when the all memory cells connected to the selected bit line are low is $5\Delta V_H$ and the voltage rise level of the word line and the unselected bit line is $5\Delta V_H$, a voltage level Vbiasc1 applied to the selected memory cell is found by the following formula 7.

$$V\text{biasc1}=V2+5\Delta V_H-(V1+5\Delta V_H)=V2-V1 \quad (7)$$

Similarly, when the resistance value of all the memory cells connected to the selected bit line are high, the current flowing in the selected bit line is the smallest and the voltage level $V_{N1}$ at the node N1 becomes the lowest. Therefore, the voltage level $V_{N2}$ at the node N2 that is the inversion level of the voltage level $V_{N1}$ at the node N1 becomes highest. Thus, the VNG1 signal and the VPG1 signal are formed based on the voltage level VN2, and the VNG signal is inputted to the gate of the NMOS and the VPG signal is inputted to the gate of the PMOS connected to the inverters 33 in the feedback circuits (row voltage displacement suppressor circuit 31 and the column voltage displacement suppressor circuit 41) in the word line drive circuit 11 and the bit line drive circuit 12, whereby the voltage level of the all the word lines and unselected bit lines become low.

Here, when it is assumed that the voltage rise level of the selected bit line is $\Delta V_H$, the voltage level applied to the memory cell to be read can be kept at a constant value by adjusting the voltage rise level of the word line and unselected bit line so as to be the same as $\Delta V_H$. In this case, since the voltage rise level when the all memory cells connected to the selected bit line are high is $\Delta V_H$ and the voltage rise level of the word line and the unselected bit line is $\Delta V_H$, a voltage level Vbiasc2 applied to the selected memory cell is found by the following formula 8.

$$V\text{biasc2}=V2+\Delta V_H-(V1+\Delta V_H)=V2-V1 \quad (8)$$

In addition, as one example of the memory cell, the following ones are considered. For example, the memory according to one or more embodiments can be applied to a phase change memory using phase change of a crystal phase (resistance is low) and an amorphous phase (resistance is high), in a phase change of a phase transition material such as a chalcogenide compound. In addition, it can be applied to a polymer memory and a polymer ferroelectric RAM (PFRAM) whose ferroelectric polarization state is changed in polarization orientation of a fluorine resin group material molecule (polar conductive polymer molecule), using a fluorine resin group material as a memory cell. Furthermore, it can be applied to a memory cell formed of an Mn oxide group material such as PCMO ($Pr_{(1-x)}Ca_xMnO_3$) having the Perovskite structure having a CMR (Colossal Magnetic Resistance) effect. This uses the fact that the resistance value of the Mn oxide group material such as PCMO constituting the memory cell element is changed when the states of two phases of a ferroelectric metal body and a diamagnetic insulator are changed.

In addition, it may be applied to a memory in which a memory cell is formed of a metal oxide such as STO (SrTiO$_3$), SZO (SrZrO$_3$) and SRO (SrRuO$_3$) and metal powder and an interface phenomenon such that the resistance value of the memory cell is changed according to an applied voltage at the interface between the metal oxide and the metal powder is used.

Furthermore, it can be applied to a memory in which a resistive element constituting a memory cell is formed of a semiconductor material. It can be applied to a memory in which a resistive element constituting a memory cell is formed of an oxide or a nitride. Also, it can be applied to a memory in which a resistive element constituting a memory cell is formed of a compound of a metal and a semiconductor. It can be applied to a memory in which a resistive element constituting a memory cell is formed of a fluorine resin material. It can be applied to a polymer ferroelectric RAM (PFRAM) in which a resistive element constituting a memory cell is formed of a conductive polymer. It can be applied to a memory (OUM) in which a resistive element constituting a memory cell is formed of a chalcogenide material. It can be applied to a memory in which a resistive element constituting a memory cell is formed of a compound having the Perovskite structure having a CMR effect. It can be applied to a MRAM in which a resistive element constituting a memory cell is formed of a spin-dependent tunnel junction element.

Another Embodiment (1) Although the embodied device can be applied to the memory cell array having the bank structure, it can also be applied to a single memory cell array that does not have the bank structure, as a matter of course.

(2) The two-terminal structured memory cell may comprise a series circuit having a variable resistive element and a diode in the above embodiment.

(3) Although the memory state is detected on the side of the word line in the above embodiment, the relation between the word line and the bit line may be inverted and the memory state may be detected on the side of the bit line.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A nonvolatile semiconductor memory device, comprising:
   a memory cell array in which a plurality of two-terminal structured memory cells each having a variable resistive element arranged to store information according to an electric resistance change are arranged in a row and column direction, a plurality of word lines extending in the row direction and a plurality of bit lines extending in the column direction are provided, the memory cells on a same row are connected at one end to a same word line, and the memory cells on a same column are connected at the other end to a same bit line;

a first voltage supply circuit arranged to supply a first voltage to a selected bit line connected to a selected memory cell to be read;

a second voltage supply circuit arranged to supply a second voltage to the word lines and unselected bit lines except the selected bit line;

a current read circuit arranged to read a current flowing in the selected memory cell from a side of a selected word line connected to the selected memory cell based on a voltage difference applied to the selected memory cell;

a voltage suppressor circuit arranged to suppress fluctuation of the second voltage with respect to each word line and bit line provided in the second voltage supply circuit; and a voltage control circuit arranged to
 apply a predetermined voltage to the selected bit line and a dummy second voltage to the unselected bit lines and the word lines,
 detect fluctuation of a voltage of the selected bit line depending on a data pattern stored in the memory cell array during a preset period prior to a reading period to detect the current flowing in the selected memory cell, and
 control the voltage suppressor circuit during the reading period so that the second voltage applied to the unselected bit lines and the word lines may fluctuate in a direction of the fluctuation which is detected.

2. The nonvolatile semiconductor memory device according to claim 1, wherein the voltage control circuit comprises a detection circuit arranged to detect a fluctuation range of the voltage of the selected bit line which fluctuates depending on the data pattern stored in the memory cell array.

3. The nonvolatile semiconductor memory device according to claim 2,
 wherein the voltage control circuit comprises a memory circuit arranged to store the fluctuation range detected by the detection circuit during the preset period, and
 wherein the voltage control circuit is arranged to control the voltage suppressor circuit based on the fluctuation range stored in the memory circuit.

4. The nonvolatile semiconductor memory device according to claim 3, wherein the memory circuit comprises a capacitor arranged to store a voltage level according to the fluctuation range.

5. The nonvolatile semiconductor memory device according claim 4, wherein the voltage level varies in a direction opposite to a fluctuation direction of the voltage of the selected bit line.

6. The nonvolatile semiconductor memory device according to claim 4, wherein the voltage control circuit comprises a current amplifier arranged to amplify a current of the voltage level and to output the amplified current.

7. The nonvolatile semiconductor memory device according to claim 4, wherein the voltage suppressor circuit comprises:
 a MOS transistor whose one end is connected to the bit line and whose other end is connected to a supply side of the second voltage; and
 an inverter circuit whose input side is connected to the bit line and whose output side is connected to a gate of the MOS transistor to control an inversion level of the inverter circuit depending on the voltage level stored in the capacitor.

8. The nonvolatile semiconductor memory device according to claim 1, wherein the voltage control circuit is arranged to control the fluctuation of the second voltage applied to the to the unselected bit lines and the word lines so that a voltage drop across the selected memory cell is substantially a constant.

9. The nonvolatile semiconductor memory device according to claim 6, wherein the voltage control circuit further comprises:
 a switch (SW0) arranged to transmit an output of the detection circuit to an input of the current amplifier;
 a switch (SW1) arranged to transmit the amplified current from the current amplifier to the capacitor of the memory circuit;
 a switch (SW2) arranged to transmit the stored voltage level of the capacity of the memory circuit to the voltage suppressor circuit; and
 a switch (SWO 1) arranged to transmit a predetermined voltage level to the voltage suppressor circuit.

10. The nonvolatile semiconductor memory device according to claim 9, wherein the voltage control circuit is arranged to:
 turn on in sequence the switches (SW01, SW0, and SW1) during the preset period,
 turn on the switch (SW2) and to turn off the switches (SW01, SW0, and SW1) at a start of the reading period, and
 turn off the switch (SW2) at an end of the reading period.

* * * * *